(12) United States Patent
Scheer et al.

(10) Patent No.: US 12,165,870 B2
(45) Date of Patent: *Dec. 10, 2024

(54) CHEMICAL AMPLIFICATION METHODS AND TECHNIQUES FOR DEVELOPABLE BOTTOM ANTI-REFLECTIVE COATINGS AND DYED IMPLANT RESISTS

(71) Applicant: Tokyo Electron Limited, Tokyo (JP)

(72) Inventors: Steven Scheer, Tokyo (JP); Michael A. Carcasi, Austin, TX (US); Benjamen M. Rathsack, Austin, TX (US); Mark H. Somervell, Austin, TX (US); Joshua S. Hooge, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 700 days.

This patent is subject to a terminal disclaimer.

(21) Appl. No.: 16/030,153

(22) Filed: Jul. 9, 2018

(65) Prior Publication Data

US 2018/0315596 A1 Nov. 1, 2018

Related U.S. Application Data

(63) Continuation of application No. 14/629,968, filed on Feb. 24, 2015, now Pat. No. 10,020,195.

(Continued)

(51) Int. Cl.
*G03F 7/09* (2006.01)
*G03F 7/11* (2006.01)
(Continued)

(52) U.S. Cl.
CPC .......... *H01L 21/0276* (2013.01); *G03F 7/091* (2013.01); *G03F 7/11* (2013.01); *G03F 7/203* (2013.01); *H01L 21/0271* (2013.01)

(58) Field of Classification Search
CPC .... H01L 21/0271; H01L 21/0276; G03F 7/11; G03F 7/091; G03F 7/203
See application file for complete search history.

(56) References Cited

U.S. PATENT DOCUMENTS 4,039,371 A * 8/1977 Brunner ............. C08J 7/12
216/83
4,308,337 A * 12/1981 Roach ............... B24B 19/165
346/137

(Continued)

FOREIGN PATENT DOCUMENTS

CN 101738872 B 4/2013
EP 583205 A1 2/1994
(Continued)

OTHER PUBLICATIONS

Machine transaltion of JP 54-045102 (1979).*

(Continued)

*Primary Examiner* — Martin J Angebranndt
(74) *Attorney, Agent, or Firm* — Wood Herron & Evans LLP (57) ABSTRACT

The disclosure herein describes methods for Photosensitized Chemically Amplified Resist Chemicals (PS-CAR) to pattern light sensitive films (e.g., photoresist on anti-reflective coatings) on a semiconductor substrate. In one embodiment, a two-step exposure process may generate higher acid concentration regions within a photoresist layer. The PS-CAR chemicals may include photoacid generators (PAGs) and photosensitizer elements that enhance the decomposition of the PAGs into acid. The first exposure may be a patterned EUV or UV exposure that generates an initial amount of acid and photosensitizer. The second exposure may be a non-EUV flood exposure that excites the photosensitizer which increases the acid generation rate where the photosensitizer is located in the film stack. The distribution (Continued)

of energy during the exposures may be optimized by using certain characteristics (e.g., thickness, index of refraction, doping) of the photoresist layer, an underlying layer, and/or an overlying layer.

22 Claims, 5 Drawing Sheets

Related U.S. Application Data (60) Provisional application No. 61/944,394, filed on Feb. 25, 2014.

(51) Int. Cl.
*G03F 7/20* (2006.01)
*H01L 21/027* (2006.01)

(56) References Cited

U.S. PATENT DOCUMENTS

| | | | |
|---|---|---|---|
| 4,402,571 A | | 9/1983 | Cowan et al. |
| 4,609,615 A | | 9/1986 | Yamashita et al. |
| 4,626,492 A | * | 12/1986 | Eilbeck ............ G03F 7/0226 430/165 |
| 4,751,169 A | | 6/1988 | Behringer et al. |
| 4,804,612 A | | 2/1989 | Asaumi et al. |
| 4,931,380 A | | 6/1990 | Owens et al. |
| 4,933,263 A | | 6/1990 | Okuda et al. |
| 5,338,178 A | * | 8/1994 | Kato ............... B29D 17/005 216/24 |
| 5,370,973 A | | 12/1994 | Nishii |
| 5,468,595 A | * | 11/1995 | Livesay ............ G03F 7/30 430/296 |
| 5,534,970 A | | 7/1996 | Nakashima et al. |
| 5,707,784 A | | 1/1998 | Oikawa et al. |
| 5,820,679 A | | 10/1998 | Yokoyama et al. |
| 5,905,019 A | * | 5/1999 | Obszarny ........... G03F 7/168 430/327 |
| 5,976,770 A | * | 11/1999 | Sinta ............... G03F 7/091 430/325 |
| 6,040,118 A | * | 3/2000 | Capodieci ........... G03F 7/2022 430/328 |
| 6,180,320 B1 | | 1/2001 | Saito et al. |
| 6,242,160 B1 | | 6/2001 | Fukuzawa et al. |
| 6,245,492 B1 | | 6/2001 | Huang et al. |
| 6,296,985 B1 | | 10/2001 | Mizutani et al. |
| 6,331,383 B1 | | 12/2001 | Sakai |
| 6,417,083 B1 | * | 7/2002 | Mori ............... H01L 21/28123 257/E21.206 |
| 6,420,101 B1 | * | 7/2002 | Lu ................ G03F 7/2022 257/E21.027 |
| 6,440,632 B2 | * | 8/2002 | Yasuda ............ C08K 5/0033 430/191 |
| 6,555,479 B1 | * | 4/2003 | Hause ............. H01L 21/31144 257/E21.257 |
| 6,699,641 B1 | | 3/2004 | Hellig et al. |
| 6,844,135 B2 | | 1/2005 | Kon et al. |
| 6,900,001 B2 | | 5/2005 | Livesay et al. |
| 6,968,253 B2 | | 11/2005 | Mack et al. |
| 7,142,941 B2 | | 11/2006 | Mack et al. |
| 7,327,436 B2 | | 2/2008 | Fukuhara et al. |
| 7,488,933 B2 | | 2/2009 | Ye et al. |
| 7,829,269 B1 | | 11/2010 | Fonseca et al. |
| 7,858,289 B2 | | 12/2010 | Yamashita |
| 7,966,582 B2 | | 6/2011 | Melvin, III et al. |
| 8,088,548 B2 | | 1/2012 | Houlihan et al. |
| 8,428,762 B2 | | 4/2013 | Graves et al. |
| 8,443,308 B2 | | 5/2013 | Shiely et al. |
| 8,589,827 B2 | | 11/2013 | Biafore et al. |
| 9,009,647 B2 | | 4/2015 | Ye et al. |
| 9,519,227 B2 | | 12/2016 | Carcasi et al. |
| 9,618,848 B2 | | 4/2017 | Carcasi et al. |
| 9,645,495 B2 | | 5/2017 | deVilliers |
| 9,746,774 B2 | | 8/2017 | Carcasi et al. |
| 10,020,195 B2 | * | 7/2018 | Scheer ............. H01L 21/0276 |
| 2002/0030800 A1 | | 3/2002 | Nellissen |
| 2002/0102490 A1 | | 8/2002 | Ito et al. |
| 2003/0049571 A1 | | 3/2003 | Hallock et al. |
| 2003/0163295 A1 | | 8/2003 | Jakatdar et al. |
| 2004/0152024 A1 | | 8/2004 | Livesay et al. |
| 2005/0008864 A1 | | 1/2005 | Ingen Schenau et al. |
| 2005/0214674 A1 | * | 9/2005 | Sui ................ G03F 7/091 430/270.1 |
| 2006/0040208 A1 | | 2/2006 | Tarutani et al. |
| 2006/0269879 A1 | | 11/2006 | Elian et al. |
| 2007/0032896 A1 | | 2/2007 | Ye et al. |
| 2007/0049651 A1 | * | 3/2007 | Watanabe ........... C09D 11/101 522/71 |
| 2007/0184648 A1 | | 8/2007 | Yoon et al. |
| 2007/0275330 A1 | | 11/2007 | Bailey et al. |
| 2007/0292770 A1 | | 12/2007 | Strauss |
| 2008/0038675 A1 | | 2/2008 | Nagasaka |
| 2008/0230722 A1 | | 9/2008 | Elian |
| 2009/0092933 A1 | * | 4/2009 | Hishiro ............ G03F 7/203 430/325 |
| 2009/0162796 A1 | | 6/2009 | Yun et al. |
| 2009/0214985 A1 | | 8/2009 | Kulp |
| 2009/0274974 A1 | | 11/2009 | Abdallah et al. |
| 2010/0119972 A1 | | 5/2010 | Houlihan et al. |
| 2010/0213580 A1 | | 8/2010 | Meador et al. |
| 2010/0227282 A1 | * | 9/2010 | Shirley ............ G03F 7/2022 430/326 |
| 2010/0245790 A1 | | 9/2010 | Seltmann et al. |
| 2010/0273099 A1 | | 10/2010 | Fonseca et al. |
| 2010/0291490 A1 | | 11/2010 | Tsuruda et al. |
| 2011/0043791 A1 | | 2/2011 | Smilde et al. |
| 2011/0147984 A1 | | 6/2011 | Cheng et al. |
| 2011/0171569 A1 | | 7/2011 | Nishimae et al. |
| 2011/0177464 A1 | | 7/2011 | Takeda et al. |
| 2011/0205505 A1 | | 8/2011 | Somervell et al. |
| 2011/0250540 A1 | | 10/2011 | Huang et al. |
| 2012/0171616 A1 | * | 7/2012 | Thackeray .......... G03F 7/0046 430/285.1 |
| 2013/0084532 A1 | | 4/2013 | Wu et al. |
| 2013/0164691 A1 | | 6/2013 | Shiobara |
| 2013/0171571 A1 | | 7/2013 | Dunn et al. |
| 2013/0204594 A1 | | 8/2013 | Liu |
| 2013/0232457 A1 | | 9/2013 | Ye et al. |
| 2013/0234294 A1 | | 9/2013 | Hu et al. |
| 2013/0260313 A1 | | 10/2013 | Allen et al. |
| 2014/0227538 A1 | | 8/2014 | Baldwin et al. |
| 2015/0214056 A1 | | 7/2015 | Xu et al. |
| 2015/0241781 A1 | | 8/2015 | Carcasi et al. |
| 2015/0241782 A1 | | 8/2015 | Scheer et al. |
| 2015/0241783 A1 | | 8/2015 | Carcasi et al. |
| 2015/0241793 A1 | | 8/2015 | Carcasi et al. |
| 2016/0004160 A1 | | 1/2016 | Tagawa et al. |
| 2016/0048080 A1 | | 2/2016 | deVilliers |
| 2016/0357103 A1 | | 12/2016 | Nagahara et al. |
| 2017/0052448 A1 | | 2/2017 | Nakagawa et al. |
| 2017/0052449 A1 | | 2/2017 | Nakagawa et al. |
| 2017/0052450 A1 | | 2/2017 | Nakagawa et al. |
| 2017/0192357 A1 | | 7/2017 | Carcasi et al. |
| 2017/0242342 A1 | | 8/2017 | Carcasi et al. |
| 2017/0242344 A1 | | 8/2017 | Carcasi et al. |
| 2017/0329229 A1 | | 11/2017 | Carcasi et al. |
| 2017/0330806 A1 | | 11/2017 | deVilliers et al. |
| 2019/0094698 A1 | * | 3/2019 | Carcasi ............. G03F 7/2022 |

FOREIGN PATENT DOCUMENTS

| | | | |
|---|---|---|---|
| EP | 2048700 A2 | | 4/2009 |
| JP | 54-045102 | * | 4/1979 |
| JP | 04-239116 A | | 8/1992 |
| JP | H04363014 A | | 12/1992 |
| JP | H06275484 A | | 9/1994 |
| JP | H08181049 A | | 7/1996 |
| JP | 09-211871 A | | 8/1997 |
| JP | H10083947 A | | 3/1998 |
| JP | 2000-208408 A | | 7/2000 |
| JP | 2002006512 A | | 1/2002 |

(56) References Cited

FOREIGN PATENT DOCUMENTS

| | | | |
|---|---|---|---|
| JP | 2002-072488 | * | 3/2002 |
| JP | 2003162060 A | | 6/2003 |
| JP | 2005173322 A | | 6/2005 |
| JP | 2005175259 A | | 6/2005 |
| JP | 2007501431 A | | 1/2007 |
| JP | 2007334036 A | | 12/2007 |
| JP | 2008095087 A | | 4/2008 |
| JP | 2008543033 A | | 11/2008 |
| JP | 2012511742 A | | 5/2012 |
| JP | 2012511743 A | | 5/2012 |
| JP | 2013140319 A | | 7/2013 |
| JP | 2013228447 A | | 11/2013 |
| JP | 201429435 A | | 2/2014 |
| JP | 2015172741 A | | 10/2015 |
| KR | 20120058572 A | | 6/2012 |
| TW | I273457 B | | 2/2007 |
| TW | 201539539 A | | 10/2015 |
| TW | 201541194 A | | 11/2015 |
| WO | 2003001297 A2 | | 1/2003 |
| WO | 2005013007 A1 | | 2/2005 |
| WO | 2011086933 A1 | | 7/2011 |
| WO | 2013007442 A1 | | 1/2013 |

OTHER PUBLICATIONS

Taiwan Intellectual Property Office, Notice of Allowance issued in corresponding Taiwanese Patent Application No. 106115728 dated Feb. 15, 2019.
U.S. Patent and Trademark Office, Office Action issued in corresponding U.S. Appl. No. 16/154,018 dated Mar. 8, 2019.
U.S. Patent and Trademark Office, Office Action issued in corresponding U.S. Appl. No. 15/048,584 dated Feb. 15, 2019.
Wang, C.W. et al., "Photobase generator and photo decomposable quencher for high-resolution photoresist applications," Proc. SPIE 7639, Advances in Resist Materials and Processing Technology XXVII, 76390W (Mar. 29, 2010).
U.S. Patent and Trademark Office, Non-final Office Action issued in corresponding U.S. Appl. No. 15/048,584 dated Aug. 8, 2018, 45 pp.
PCT Office, International Preliminary Report on Patentability issued in PCT/US2017/032435 mailed on Nov. 22, 2018, 8 pages.
PCT Office, International Preliminary Report on Patentability issued in PCT/US17/032450 mailed on Nov. 22, 2018, 8 pages.
U.S. Patent and Trademark Office, Office Action in corresponding U.S. Appl. No. 15/445,738 dated Sep. 14, 2018.
U.S. Patent and Trademark Office, Office Action in corresponding U.S. Appl. No. 15/594,139 dated Aug. 9, 2019.
Semiconductor Onesource: Semiconductor Glossary—Search for: critical dimension, cd copyright 2016, one page (Year: 2016).
Kang et al., Microelectronics Reliability 46 (2006) 1006-1012. (Year: 2006).
Definition of critical dimension—cd—Chemistry Dictionary Definition of critical dimension (CD) copyright 2017 one page from chemicool.com. (Year 2017).
U.S. Patent and Trademark Office, Office Action in corresponding U.S. Appl. No. 15/594,139 dated Jan. 10, 2019.
S. Tagawa, et al., "Super High Sensitivity Enhancement by Photo-Sensitized Chemically Amplified Resist Process", Journal of Photopolymer Science and Technology, vol. 26, No. 6 (2013), pp. 825-830.
S. Tagawa, et al., "New Sensitization Method of Chemically Amplified EUV/EB Resists," presented at the 2013 International Symposium on EUV Lithography. Toyama, Japan Oct. 6-10, 2013.
A Ravve, "Light-Associated Reactions of Synthetic Polymers", Springer Science-Business Media, ISBN 0387318038, pp. 23-25, 2006.
Lowes et al. "Comparative Study of Photosensitive versus Non-Photosensitive Developer-Soluble Bottom Anti-Reflective Coating Systems", ECS Transactions 27(1) pp. 503-508 (2010).
Nagahara et al., Challenge Toward Breakage of RLS Trade-off for EUV Lithography by Photosensitized Chemically Amplified Resist (PSCAR) with Flood Exposure, SPIE International Society for Optical Engineering Proceedings, vol. 9776, Mar. 18, 2016, 18 pp.
"Understanding Brewer Science ARC products", Brewer Science (23 pages (2002)).
Japanese Patent Office, Office Action in corresponding Japanese Patent Application No. 2016-570931 dated Aug. 20, 2019.
U.S. Patent and Trademark Office, Office Action in corresponding U.S. Appl. No. 15/445,738 dated Apr. 15, 2019.
Wolf, Stanley and Tauber, Richard, Silicon Processing for the VLSI Era, vol. 1, Process Technology, Lattice Press, Sunset Beach, California, pp. 407-409 and 441-446, 1986.
Japan Patent Office, Office Action issued in related JP Patent Application No. 2016-553436 dated Jun. 19, 2018, 10 pp., including English translation.
Taiwan Intellectual Property Office, Office Action issued in related TW Patent Application No. 106105403 dated Jun. 28, 2018, 7 pp., including English translation.
Japanese Patent Office, Notice of Reasons for Rejection issued in JP2019-146060 mailed on Feb. 16, 2021.
Japanese Patent Office, Office Action issued in corresponding JP 2016-570932 mailed on May 19, 2020.
Korean Patent Office, Office Action issued in KR 10-2016-7026319 mailed on May 30, 2021.

* cited by examiner

CHEMICAL AMPLIFICATION METHODS AND TECHNIQUES FOR DEVELOPABLE BOTTOM ANTI-REFLECTIVE COATINGS AND DYED IMPLANT RESISTS

CROSS REFERENCE TO RELATED APPLICATIONS

The present application is a continuation of U.S. patent application Ser. No. 14/629,968 filed Feb. 24, 2015, issued as U.S. Pat. No. 10,020,195 on Jul. 10, 2018 and entitled CHEMICAL AMPLIFICATION METHODS AND TECHNIQUES FOR DEVELOPABLE BOTTOM ANTI-REFLECTIVE COATINGS AND DYED IMPLANT RESISTS, which claims the benefit of U.S. Provisional Patent Application No. 61/944,394, filed on Feb. 25, 2014, and entitled CHEMICAL AMPLIFICATION METHODS AND TECHNIQUES FOR DEVELOPABLE BOTTOM ANTI-REFLECTIVE COATINGS AND DYED IMPLANT RESISTS, both of which are incorporated herein by reference in their entirety.

BACKGROUND OF THE INVENTION

Developer-soluble Bottom Anti-reflective Coating (DBARC) technology offers a unique ability to offer substrate reflection control without the need for a BARC open etch which is attractive for applications electronic device manufacturing. Implant lithography benefits from DBARC technology due to improved reflection control, particularly for 193 nm implant layers. DBARC technology also offers a reduced Cost of Ownership for all photolithography layers by replacing conventional lithography BARC with DBARC which eliminates the BARC open etch step. Accordingly, techniques to improve reflection control and reduce cost may be desirable.

SUMMARY

This disclosure relates to material and process improvements to help with DBARC process integration and CD/profile control primarily for photolithography used to manufacture electronic devices, particularly implant layer lithography. One approach to improving acid generation within photosensitive materials may be to incorporate chemical compounds that amplify the chemical reactions that may occur during the exposure process. One example of this approach may be a chemically amplified resist (CAR) that may increase the chemical reactions within the photosensitive material or resist. In this way, the concentrations of chemicals in the resist may increase to a larger degree than they otherwise would in view of the amount or type of light exposure that was received. The photosensitive materials may include, but are not limited to, photoresist, dyed photoresist, or anti-reflective coating films.

Developer-soluble Bottom Anti-reflective Coating (DBARC) technology is being considered by industry for its unique ability to offer substrate reflection control without the need for a BARC open etch process. Relative to DBARCs, there are at least three implementation pathways purposed for DBARC: 1) Non-photosensitive developer-soluble systems, exhibiting isotropic development, such as polyamic acid derivatives. 2) Photosensitive DBARCs that initiate a photosensitive cleave reaction for develop solubility, such as benzyl methacrylate (BMA) and mevalonic lactone methacrylate (MLMA) or initiate a crosslink/de-crosslink reaction for develop solubility, such as vinylozy materials with hydroxyl containing polymers. 3) Photoresist-induced development behavior in photoacid generator-less (PAG-less) DBARCs. In this third approach, the DBARC is not inherently light sensitive and depends on diffusing photoacid from the exposed photoresist for development. Alternatively, the acid amplification techniques may also be applied to photoresist and the scope of the claims is not limited to DBARC applications.

In two of the three pathways, one approach may be implemented by incorporating photosensitive chemically amplified resist (PS-CAR) chemistries into the DBARC itself rather than, or in addition too, the photoresist. This approach may help to eliminate organic residue remaining due to acid concentration amplification in the DBARC from the PS-CAR chemistries/UV flood dose. This technique may also allow for a separate DBARC CD control knob which may allow easier exposure latitude matching/control via the UV flood dose. With regard to DBARC implementation pathway 3, which may make use of a photoresist-induced development behavior in PAG-less DBARC, another approach may be to incorporate the PSCAR chemistries into the photoresist and using reflectivity control to insure a high acid concentration at the resist/BARC interface. This embodiment may also help to eliminate organic residue remaining due to higher acid concentration in the DBARC from resist/DBARC diffusion processes. It may also allow for a separate DBARC CD control knob which may allow for easier exposure latitude matching/control via the UV flood dose.

Several possible approaches may exist to selectively control the concentration of acid within the DBARC and/or photoresist layers. One approach may be to make or alter the PS-CAR chemistries to induce the PAG or other compounds to have a higher affinity for one film interface over another film interface. In this way, the PAG or other compounds may diffuse or migrate to locations within a film based, at least in part, on surface energy or chemical potential differences. Alternatively, the film stack may incorporate light absorbing elements (e.g., chromophores) within certain locations within the film stack. The light absorbing elements may absorb light and transfer the energy to adjacent chemicals that may be used to generate acid proximate to the light absorbing elements. In this way, acid generation within a film or at the interfaces of the film stack may be controlled to generate a higher acid concentration within a desired region of the film or film stack than in other regions that may not include the light absorbing materials. Another approach to generating higher acid concentrations within a film or film stack may be to selectively introduce higher levels of energy at selected regions of the film stack. For example, under the principle of superposition, the constructive interference of the incident and reflected light within the film stack may generate a higher level of energy within a localized region of the film stack based, at least in part, on the light wavelength, index of refraction of the films, and/or thickness of the films. The light within the constructive interference region may transfer a higher amount of energy into the film, which may result in a higher amount of acid being generated within that region than in other portions of the film where constructive interference may not occur or at a lower magnitude. Another approach may be to use a combination of one or more of the aforementioned approaches.

The film stack may include an anti-reflective coating (ARC) layer disposed between a photoresist layer and an underlying layer on a substrate. The PS-CAR chemistry may be incorporated into the ARC layer or the photoresist layer. The acid generation within the film stack may occur within the ARC layer or the photoresist layer to optimize the geometry of the openings when the photoresist layer may be developed. The chemistry and/or physical configuration of the film stack may be optimized in conjunction with a light exposure process to selectively generate higher concentrations of acid within selected regions of the film stack.

In one embodiment, the ARC layer or the photoresist layer may incorporate chemical compounds that amplify the chemical reactions that may occur during the exposure process. One example of this approach may be to use a PS-CAR that may increase the chemical reactions or chemical concentrations within the photosensitive material or photoresist. The chemical concentrations within the photoresist may be controlled by using a two-step exposure process.

The first exposure may be a patterned exposure that generates a photosensitizer (PS) and acids from a photoacid generator (PAG) by the reaction of chemicals within the resist. The first exposure process may be tuned to maximize the absorbance by the PS and maximize the absorbance of the PAG. This may be accomplished, in one embodiment, by choosing light wavelengths of less than 300 nm. The second exposure may excite the PS which may decompose the additional PAG to obtain amplification of the acid in the exposed pattern area while minimizing the acid concentration in the dark or unexposed areas of the first exposure. In one embodiment, the two-step exposure process may use two different wavelengths (e.g., extreme ultraviolet (EUV), Ultraviolet light). The patterned exposure may use EUV or UV spectrum wavelengths and the flood exposure may use UV spectrum wavelengths. The PS-CAR chemistry may be configured to have a first light wavelength activation threshold that controls the generation of acid to a first acid concentration in the ARC layer or the photoresist layer. The second exposure may generate a second higher concentration from the first acid concentration due to the PS-CAR chemistry having a second light wavelength activation threshold that increases the first acid concentration to a second acid concentration.

In another embodiment, acid may be selectively generated within the film stack by altering the structure of the film stack to induce constructive interference within desired regions of the film stack. This may be accomplished by optimizing layer thicknesses, the index of refraction of the layers, and/or the light wavelength and/or dose. In an alternative embodiment, light may be absorbed within localized regions of the film stacks which selectively include light absorbing materials (e.g., chromophores).

BRIEF DESCRIPTIONS OF THE DRAWINGS

The accompanying drawings, which are incorporated in and constitute a part of this specification, illustrate embodiments of the invention and, together with a general description of the invention given above, and the detailed description given below, serve to explain the invention. Additionally, the left most digit(s) of a reference number identifies the drawing in which the reference number first appears.

DETAILED DESCRIPTION

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

In semiconductor manufacturing, photoresist or light sensitive materials have been used to manufacture electronic devices by depositing, patterning, and etching films on a substrate. Shrinking the dimensions of the electronic devices and maintaining image quality (e.g., resolution, line width roughness, and sensitivity) to improve device performance and yield. Extreme Ultraviolet (EUV) photolithography is one approach to shrinking dimensions that has inherent limitations that may impact existing photoresist chemistries. For example, EUV photoresist may need to compensate for the lower power of EUV light sources while maintaining resist sensitivity and image resolution. One approach to addressing the lower power limitation may include using Photosensitized Chemically Amplified Resist (PS-CAR) as described in the paper entitled "Super High Sensitivity Enhancement by Photo-Sensitized Chemically Amplified Resist (PS-CAR) Process," by Seiichi Tagawa, et. al., Journal of Photopolymer Science and Technology, vol. 26 (2013) No. 6, pg. 825-830. Although the use of PS-CAR has provided an opportunity to enable EUV processing, additional techniques may be used to improve adsorption and reflectivity control in the photoresist layer or ARC layer to improve image quality for EUV processing. However, these techniques may not be limited to EUV processing and may be also used for UV photolithography processing.

The PS-CAR chemistry may be enabled by a two-step exposure process that may generate different concentrations of acid and/or photosensitizer (PS) based, at least in part, on the type of light being exposed to the substrate coated with the photoresist. The acid may be generated when the light interacts with the PAG in the photoresist and the PS may be generated when the light interacts with the PS generator that may be incorporated into the photoresist.

The PS-CAR photoresist may include a photosensitizer generation compound and a photoacid generation (PAG) compound. A photosensitizer molecule may absorb light energy and transfer the light energy to another molecule (e.g., PAG). Some PS compounds may transfer energy in a ground state while others may conduct the transfer in an excited state. The PS generation compound may include, but is not limited to acetophenone, triphenylene, benzophenone, fluorenone, anthraquinone, phenanthrene, or derivatives thereof. A photoacid generator (PAG) may be cationic photoinitiator that may convert absorbed light energy into chemical energy (e.g., acidic reaction). The acid generation compound may include, but is not limited to, at least one of the following: triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane, 4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

Figure 1A:
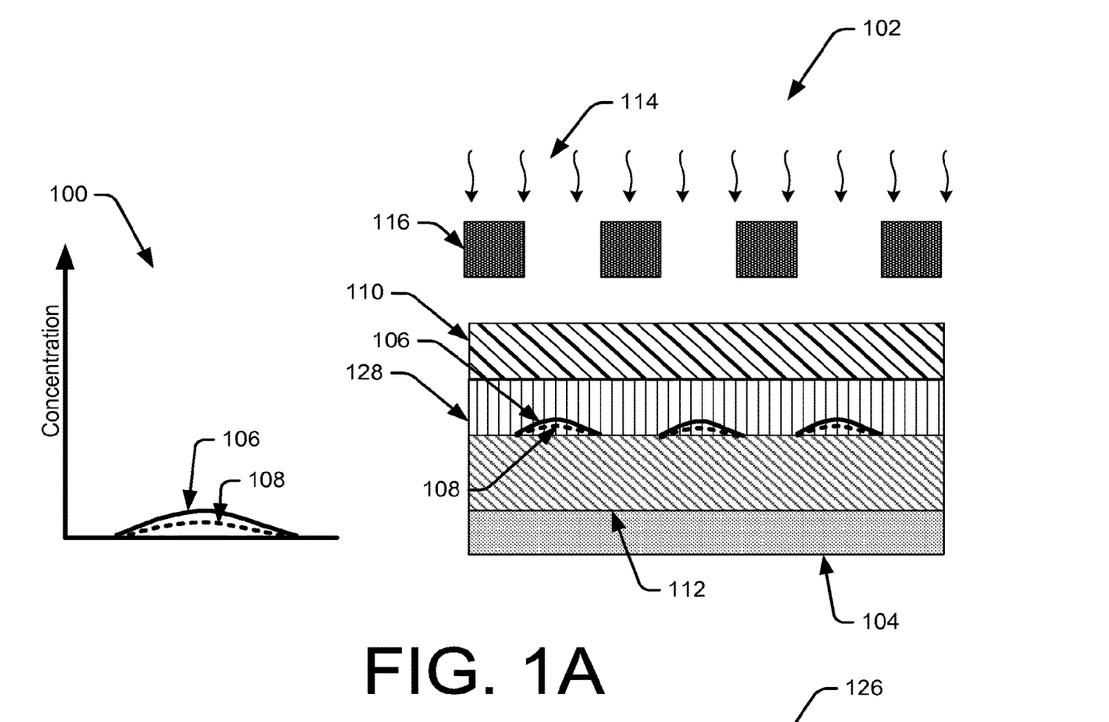
FIG. 1A illustrates chemical concentration profiles for a PS-CAR anti-reflective coating (ARC) layer after being exposed to a first range of light wavelengths and a cross section representation of a film stack on a substrate that is receiving a patterned exposure of the first wavelength of light.
Figure 1B:
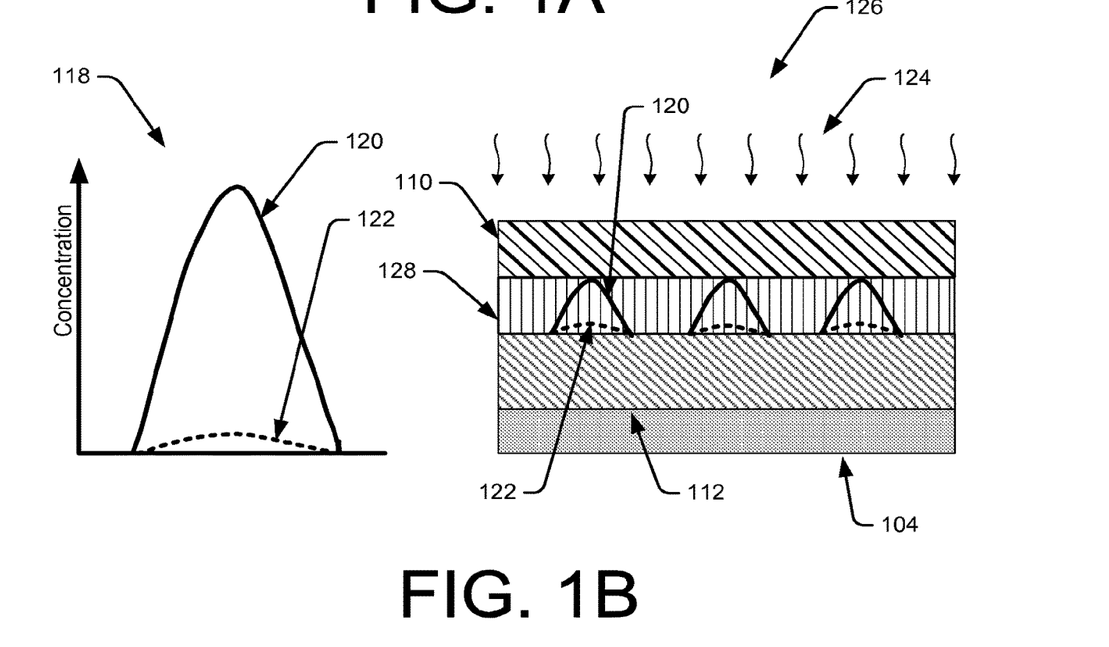
FIG. 1B illustrates chemical concentration profiles for the PS-CAR ARC layer in FIG. 1A after being exposed to a second range of light wavelengths and a cross section representation of the film stack on that substrate that is receiving a flood exposure to the second range of light wavelengths.

Turning to FIGS. 1A & 1B, FIG. 1A includes a graphic illustration 100 of the concentration of the acid 106 and PS 108 following the first exposure and a cross section diagram 102 of a film stack on a substrate 104. FIG. 1B includes a graphic illustration 118 of the concentration of the acid 120 and PS 122 following the second exposure and a cross section diagram 126 of a film stack on a substrate 104. In one embodiment, the first exposure may have a majority of light 114 wavelengths that may be less than 300 nm and a portion of the second exposure may have a majority of light wavelengths that may be greater than 300 nm.

The graphic illustration 100 in FIG. 1A illustrates the results of the first exposure where the PS-CAR may be configured to generate a relatively lower concentration of acid 106 and PS 108 during the first exposure. The first exposure light wavelengths light may have a relatively lower energy that generates an initial amount of acid 106 and an initial amount of PS 108. The graphic illustration 100 is used for the purpose of explanation and intended to show the difference in concentrations during the two-step process and is not intended to limit the scale or scope of the concentration during the first or second exposure. The intent is to highlight that the PAG may not be fully decomposed or converted to acid during the first exposure and that the second exposure may increase the acid concentration within the ARC layer 128.

In one embodiment, the film stack may include a photoresist layer 110 deposited on an anti-reflective coating (ARC) layer 128 and an underlying layer 112 that was formed or deposited on the substrate 104. The ARC layer 128 may include, but is not limited to the PS-CAR chemistry, and may retain additional elements that may be used to control the reflectivity or absorbance of light. During the first exposure, the initial amount of acid 106 and the initial amount of PS 108 may be generated when the first wavelength of light 114 is exposed through a pattern mask 116. The PS-CAR chemical reaction is initiated when the light 114 interacts with the exposed areas of the ARC layer 128. The unexposed areas where the light 114 does not interact with the ARC layer 128, the PS-CAR chemical reaction may not occur or may occur at a minimal or negligible amount compared to the exposed areas. As shown in cross section diagram 102, the concentration of the acid/PS may be higher at the exposed areas of the ARC layer 128. In this specific embodiment, the acid/PS concentration may be higher at the interface of the ARC layer 128 and the underlying layer 112 or at the interface of the ARC layer 128 and the photoresist layer 110. The location of the peak acid/PS concentration may vary depending on the film stack and exposure characteristics.

In FIG. 1B, the second graphic illustration 118 shows a higher level of acid 120 concentration and/or PS concentration 122 following the second exposure of the ARC layer 128. The second exposure may be a flood or blanket exposure of a second range of light 124 wavelengths. However, the PS 122 will increase the acid concentration or decomposition rate of the PAG. The PS 122 may be located in the portions of the photoresist layer 110 that were exposed to the first wavelength 114 during the first exposure. Accordingly, the acid concentration 120 may be higher at those locations relative to the unexposed locations of the first exposure, as shown in the second exposure cross section diagram 126.

The acid concentration 122 and location may be optimized using a variety of characteristics of the photoresist layer 110, ARC layer 128, and/or underlying layer 112 to control the amount of acid concentration 122 or the location of the acid concentration within ARC layer 128 in addition to those techniques described in "Super High Sensitivity Enhancement by Photo-Sensitized Chemically Amplified Resist Process" by Seiichi Tagawa et. al, Journal of Photopolymer Science and Technology, Vol. 26, Number 6 (2013), pgs. 825-830. These techniques may increase the amount of energy that may be transferred to the PAG/PS during the exposure steps to tailor the post-development profile or geometry of the photoresist layer 110.

In other embodiments, a patterned exposure may be used to selectively generate acid within different regions of the film stack. In one approach, the location of the acid generators or enhancers may be directed towards localized regions within the film stack. Broadly, this may include altering the chemical composition or characteristics of the ARC layer 128 or the photoresist layer 110. This approach may include, but is not limited to, making or altering the PS-CAR chemistries to induce the PAG or other compounds to have a higher affinity for one film interface over another film interface. In this way, the PAG or other compounds may diffuse or migrate based on surface energy or chemical potential differences.

In another approach, higher levels of energy may be selectively transferred to the ARC layer 128 or the photoresist layer 110 to generate higher concentrations of acid at those select locations. In one embodiment, the film stack may incorporate light absorbing elements (e.g., chromophores) within certain locations within the film stack. The light absorbing elements may absorb the light and transfer the energy to adjacent generator chemicals that may be used to generate acid proximate to the light absorbing elements. In this way, acid generation within a film or at the interfaces of the film stack may be controlled to generate a higher acid concentration within a desired region of the film or film stack than in other regions that may not include the light absorbing materials.

In one embodiment, the ARC layer 128 or the photoresist layer 110 may include the non-uniform incorporation of PSCAR chemistries. This may include introducing segregation capabilities of the PSCAR chemistry within the ARC layer 128 or the photoresist layer 110. This usually involves tailoring individual ARC layer 128 or the photoresist layer 110 chemical components to have different affinities to the interfaces within the film stack. The segregation capability may be augmented by tailoring of coat and bake hardware to provide an added driving force for chemical component separation. One embodiment may be to drive higher concentration of PSCAR chemistry/photosensitizer to the substrate 104 (Si, oxide, nitride, etc.) to help with ensuring enough acids are present to de-protect the ARC layer 128 near the substrate surface to ensure no organic residue remains at the ARC layer 128 or the photoresist layer 110/substrate 104 interface. Another embodiment may be to drive higher concentration of PSCAR chemistry/photosensitizer to the ARC layer 128/photoresist layer 110 interface to ensure enough acids are present to de-protect the ARC layer 128 near the ARC layer 128/photoresist layer 110 interface and/or to ensure ARC layer 128 wall tapering from top to bottom. These embodiments may be applied to angled implants where a taper resist/ARC sidewall is preferred to prevent shadowing effects. Further, these embodiments may allow for a separate ARC CD control knob which may allow easier exposure latitude matching/control via the UV flood dose choice. This embodiment may also potentially help eliminate organic residue remaining due to higher acid concentration within the ARC from the photosensitizer/UV flood excitation and subsequent ARC PAG decomposition processes. Finally, this embodiment may allow for additional side wall angle (SWA) control, which can help tailor the profile (tapering) for angled implants to prevent shadowing effects.

In another embodiment, the ARC layer 128 or the photoresist layer 110 may include one or more chromophore(s)/dyes specific to the UV flood wavelength with the goal of PS-CAR and photosensitizer activation/concentration manipulation within the photosensitive ARC without having adverse effects to photoresist antireflection control at the imaging exposure wavelength. This may involve choosing a chromophore(s) for the ARC layer 128 that still allows for antireflection control within the photoresist layer 110. This may also enable the highest intensity due to UV flood absorption effects to be tailored to different regions within the ARC layer 128 or the photoresist layer 110. By choosing UV flood specific chromophore(s), a higher concentration of PSCAR chemistry/photosensitizer may be driven to the ARC/resist interface to help with ensuring enough acids are present to de-protect the ARC layer 128 near the ARC/resist interface to ensure ARC wall tapering from top to bottom. This may be helpful for subsequent angled implant processing where a taper resist/ARC sidewall is preferred to prevent shadowing effects. This embodiment may also allow for a separate ARC CD control knob which should allow easier exposure latitude matching/control of ARC and photoresist via the UV flood dose choice.

The chromophores may be selected to absorb certain wavelengths of light to optimize the amount or light wavelengths that may be reflected back into the ARC layer 128 and/or the photoresist layer 110. Typically, chromophores are generally organic compounds that include a carbon element and at least one or more of the following elements: H, O, N, Cl, Br, S, or I. The maximum absorbance wavelength of the chromophore compounds may vary between 135 nm and 400 nm. One or more chromophores may be selected to filter out undesirable light 124 wavelengths that may be reflected by an underlying layer 112 or absorbed by an overlying layer (not shown) of the photoresist layer 110. The chromophore compounds may include, but are not limited to, $CH_3$—$CH_3$, $CH_4$, $CH_3OH$, or $CH_3$—$SH$. In addition to the type and concentration, the location of the chromophore within the ARC layer 128 or the photoresist layer 110 may also impact reflectivity. The reflectivity may be impacted based, at least in part, on where the highest concentration of the chromophore is within the ARC layer 128 or the photoresist layer 110. The highest concentration may be located at any location within the photoresist layer 110 or the underlying layer 112. Generally, the concentration difference between a high concentration region and a low concentration region may be greater than at least 5% by volume, mass, or moles.

Another approach to selectively generating higher acid concentrations within a film or film stack may be to introduce higher levels of energy at selected regions of the film stack using the properties of the films stack, the incident light, and/or the reflected light from the underlying layer 112. For example, under the principle of superposition, the constructive interference of the incident and reflected light within the film stack may generate a higher level of energy within a localized region of the film stack based, at least in part, on the light wavelength, index of refraction of the films, and/or thickness of the films. The light within the constructive interference region may transfer a higher amount of energy into the film, which may result in higher amount of acid being generated within that region than in other portions of the film where constructive interference may not occur. Another approach may be to use a combination of the aforementioned approaches.

In one embodiment, the UV flood wavelength, film stack thicknesses, and film stack index of refractions may be tailored to obtain photosensitizer activation while tailoring the highest intensity from the interference of the incident and reflected UV flood light to be preferentially located in the ARC layer 128 or the photoresist layer 110. The aforementioned variables (e.g., wavelength, etc.) may be tailored to drive a higher concentration of PSCAR chemistry/photosensitizer to at least one of the interfaces of the film stack. In one embodiment, the higher acid concentration may ensure enough acids are present to de-protect the ARC layer 128 near the underlying layer 112 to ensure no organic residue remains at the ARC/underlying layer interface. In another embodiment, the aforementioned variables may be tailored to drive higher concentration of PSCAR chemistry/photosensitizer to the ARC/photoresist interface to help ensure enough acids are present to de-protect the ARC layer 128 near the ARC/photoresist interface to ensure ARC wall tapering from top to bottom. These embodiments may be used during angled implants where a taper photoresist/ARC sidewall is preferred to prevent shadowing effects. This embodiment allows for a separate ARC CD control knob which may allow easier exposure latitude matching/control via the UV flood dose choice. This embodiment may also potentially help eliminate organic residue remaining due to higher acid concentration within the ARC layer 128 from the photosensitizer/UV flood excitation and subsequent ARC PAG decomposition processes. Finally, this embodiment may allow for additional SWA control, which can help tailor the profile (tapering) for angled implants to prevent shadowing effects.

In this embodiment, the tailoring/co-optimization of ARC layer 128 or the photoresist layer 110 refractive index (RI) choice may be used to control reflectivity and allow for PSCAR photosensitizer activation/concentration manipulation within the photosensitive ARC layer 128 or photoresist layer 110. This may include choosing an ARC RI that still allows for antireflection control within the photoresist layer 110, but also allows for tailoring the highest intensity from the interference of the incoming and reflected UV flood light to be preferentially located in the ARC layer 128 or the photoresist layer 110. For example, choosing an ARC layer 128 refractive index A, may drive higher concentration of PSCAR chemistry/photosensitizer to the ARC/underlying layer interface to help with ensuring enough acids are present to de-protect the ARC layer 128 near the underlying layer 112 to ensure no organic residue remains at the ARC/underlying layer interface. In another instance, choosing ARC layer 128 refractive index B would enable a higher concentration of PSCAR chemistry/photosensitizer to the photoresist/ARC interface to help with ensuring enough acids are present to de-protect the ARC layer 128 near the ARC/photoresist interface to ensure ARC wall tapering from top to bottom. In one embodiment, the index of refraction, for the secondary exposure (e.g., >200 nm), may vary between 0.95 and 1.7 depending on the compositions and characteristics of the film stack. In other embodiments, the index of refraction, for the secondary exposure (e.g., ~193 nm) may be greater than 1.7 depending on the compositions and characteristics of the film stack.

The techniques described above may be used alone, or in combination, to selectively control acid concentration within the ARC layer 128 or the photoresist layer 110. For example, in one embodiment, the film stack may include the incorporation of chromophore(s)/dyes to at least one interface of the film stack and tailoring the chemical components of at least one film stack layer to have different affinities to one or more interfaces of the film stack. These techniques may also be applied to embodiments that incorporate the PS-CAR chemistry into the photoresist layer 110 where the ARC layer 128 may or may not be present in the film stack.

Figure 1C:
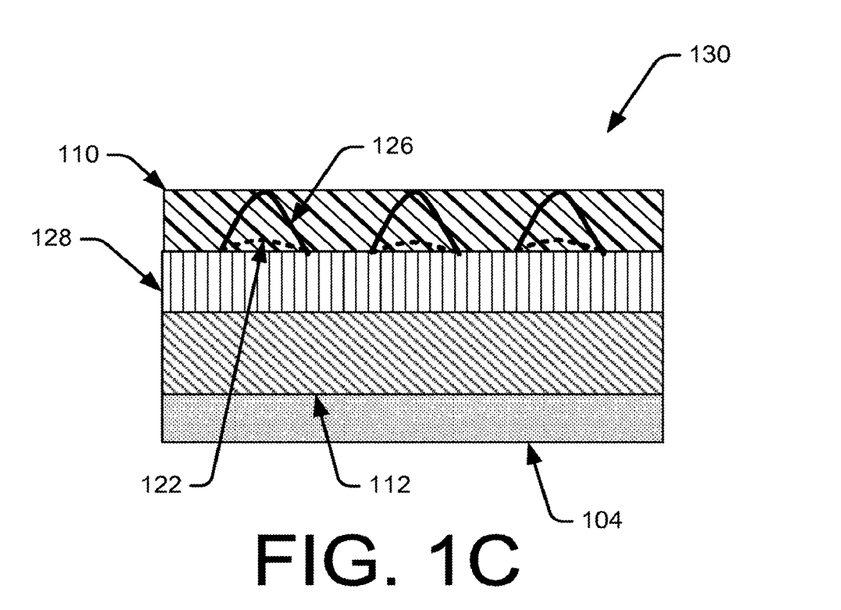
FIG. 1C illustrates a chemical concentration profile for the PS-CAR photoresist layer after being exposed to a second range of light wavelengths and a cross section representation of the film stack on that substrate that is receiving a flood exposure to the second range of light wavelengths.

FIG. 1C illustrates cross-section representation 130 of a film stack similar to the FIGS. 1A & 1B embodiments, but this embodiment incorporates the PS-CAR chemistry into the photoresist layer 110 instead of the ARC layer 128. The cross-section representation reflects the condition of the film stack post-flood exposure that followed a patterned exposure similar to FIG. 1A illustration. Accordingly, chemical concentration profiles (e.g., acid 120, PS 122) are generated within the photoresist layer 110 instead of the ARC layer 128. The techniques described above to control the location and/or concentration of the acid within the ARC layer 128 may also be applied to control the location and/or concentration of the acids within the photoresist layer 110.

Figure 1D:
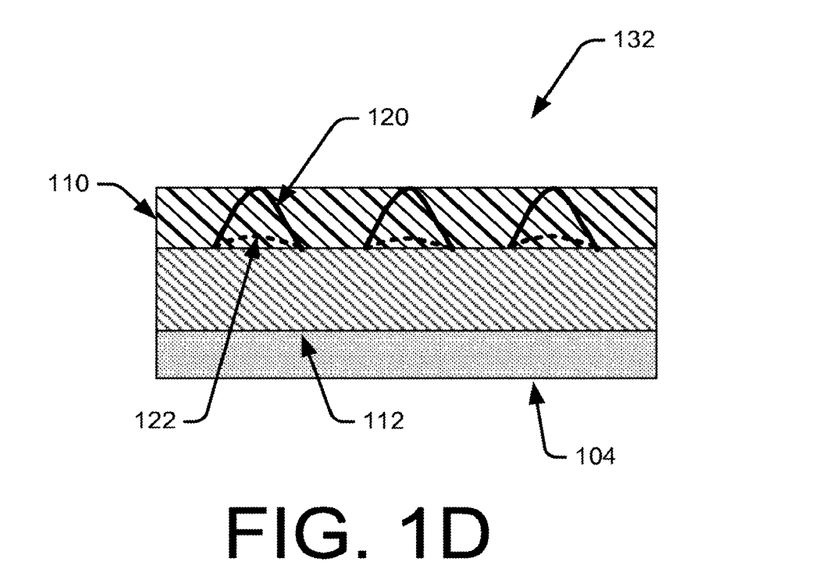
FIG. 1D illustrates a chemical concentration profile for the PS-CAR photoresist layer after being exposed to a second range of light wavelengths and a cross section representation of the film stack on that substrate that is receiving a flood exposure to the second range of light wavelengths.

FIG. 1D illustrates cross-section representation 132 of a film stack similar to the FIGS. 1A & 1B embodiments, but this embodiment incorporates the PS-CAR chemistry into the photoresist layer 110 and omits the ARC layer 128 from the film stack. The cross-section representation reflects the condition of the film stack post-flood exposure that followed a patterned exposure similar to FIG. 1A illustration. Accordingly, chemical concentration profiles (e.g., acid 120, PS 122) are generated within the photoresist layer 110. The techniques described above to control the location and/or concentration of the acid within the ARC layer 128 may also be applied to control the location and/or concentration of the acids within the photoresist layer 110. The photoresist layer 110 may include any type of light sensitive material that may be used to pattern the substrate 104. The photoresist layer 110 may include, but is not limited to, positive tone photoresist, negative tone photoresist, doped photoresist, or dyed photoresist.

The variation among film stacks embodiments illustrated in FIGS. 1A-1D may result in different process conditions to pattern the film stacks that may have various compositions (e.g., PAG) or characteristics (e.g., thickness, RI, etc.). For the purpose of ease of explanation, the description of the methods used to develop the photoresist layer 110 and the ARC layer 128 encompasses three primary embodiments. The FIG. 1A/1B embodiment incorporates the acid generation compounds within the ARC layer 128 that is disposed between the photoresist layer 110 and the underlying layer 112. The FIG. 1C embodiment that incorporates the acid generation compounds within the photoresist layer 110 that is disposed above the ARC layer 128. Finally, the FIG. 1D embodiment incorporates the acid generation compounds into the photoresist layer 110 for a film stack that doesn't include the ARC layer 128.

Figure 2:
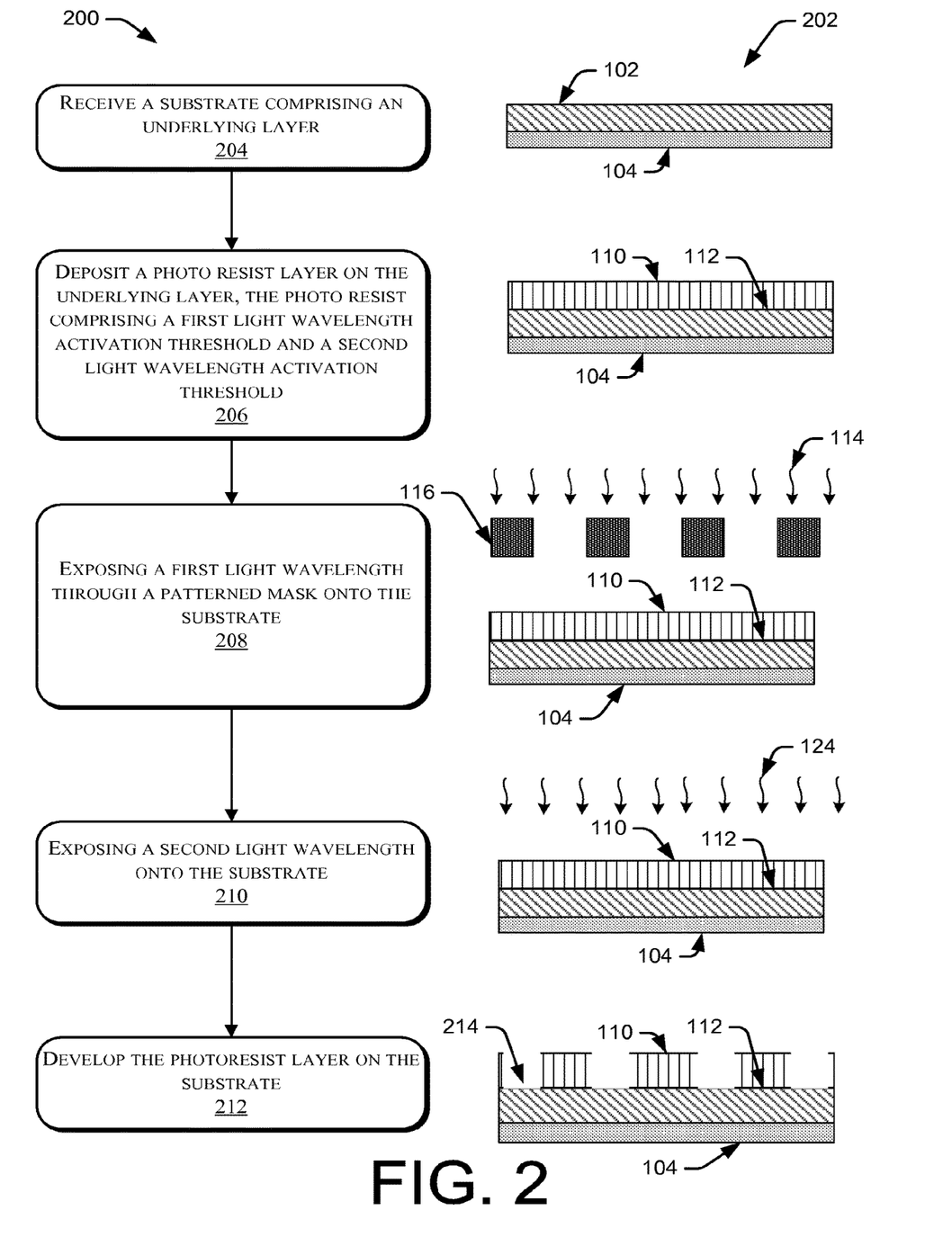
FIG. 2 includes an illustration of a flow diagram of a method for a two-step exposure process of a film stack (e.g., photoresist layer) and accompanying cross section representations of one embodiment of the method.

FIG. 2 includes an illustration of a flow diagram 200 of a method for a two-step exposure process of a film stack (e.g., photoresist layer 110, no ARC layer 128) and accompanying cross section representations 202. In this embodiment, the PS-CAR chemistry may be incorporated into the photoresist layer 110. The photoresist layer 110 may include any type of light sensitive material that may be used to pattern the substrate 104. The photoresist layer 110 may include, but is not limited to, positive tone photoresist, negative tone photoresist, doped photoresist, or dyed photoresist. The two-step exposure process may be used to enable different responses from PS-CAR elements within the photoresist layer 110. The PS-CAR elements may include the PS-CAR chemistry, acid generators, or PAGs that may be used to generate acid which may alter the light sensitivity characteristics of the photoresist layer 110. The flow diagram 200 method may be performed by one or more process chambers or tools that may deposit, pattern, expose, and/or develop the photoresist layer 110.

At block 204, the substrate 104 may be received by a coating tool that may dispense the photoresist layer 110 onto the substrate 104. The substrate 104 may include one or more underlying layers 112 that may be patterned using the photoresist layer 110. The thickness and composition of the underlying layer 112 may be optimized to control how light may be reflected from the surface of the substrate 104. In one embodiment, the type of underlying layer 112 may be selected based on the index of refraction and the thickness of the underlying layer 112. These features may be optimized with the characteristics (e.g., index of refraction, thickness, etc.) of the photoresist layer 110 to control how energy may be transferred to the photoresist layer 110 during the two-step exposure process.

At block 206, a photoresist layer 110 may be deposited or dispensed onto the underlying layer 112. The photoresist layer 110 may include two or more light wavelength activation thresholds that may enable a controlled sequence of chemical reactions within the photoresist layer 110 to generate acid at select locations and at different concentrations. The photoresist layer 110 may include a PS-CAR chemistry that may generate different concentrations or amounts of acid depending on the wavelength and/or dose of light 114. For example, when light 114 within a first range of wavelength is exposed to the photoresist layer 110, the PS-CAR chemistry may generate a first amount of acid 106 within the photoresist layer 110. However, the PS-CAR chemistry may be partially decomposed and may still be capable of generating additional acid when the PS-CAR chemistry is exposed to light within a second range of wavelength.

In one embodiment, the first and second ranges of light 114/124 wavelengths may be mutually exclusive and not include any overlap of wavelengths. For example, the first range may be anything less than 200 nm and the second range may be greater than or equal to 200 nm. In other embodiments, the wavelengths may overlap such that the first range may be less than 100 nm and the second range may be anything greater than 5 nm. In one specific embodiment, the first range of light 114 wavelengths may be less than 30 nm (e.g., 13.5 nm) and the second range of light 114 wavelengths may be greater than 200 nm. In another specific embodiment, the first range of light 114 wavelengths may be less than or equal to 193 nm and the second range of light 114 wavelengths may be greater than 200 nm. In another specific embodiment, the first range of wavelengths are less than or equal to 248 nm and the second range of wavelengths are greater than 200 nm. The photoresist layer 110 may be used for dry or immersion lithography processing or KrF laser lithography processing or EUV lithography processing.

In addition to chromophores, the reflectivity may be influenced by the index of refraction and/or thickness of the photoresist layer 110 and/or the underlying layer 112. The index of refraction may be a quantitative representation of how much light 124 will bend or refract when propagating into a medium. The index of refraction may be a ratio between the speed of light in a vacuum and the speed of light within the medium. Altering the direction of the light 124 may enable more energy to be transferred into the photoresist layer 110 and/or the underlying layer 112. For example, the light may be reflected along a longer portion of the film stack or may be reflected back into the photoresist layer 110 from the underlying layer 112 and/or the substrate 104. The incoming light and the reflected light may generate more energy within the film stack due to the interference between the incoming light 124 and the reflected light (not shown). The interference locations may be optimized to occur at desired locations within the film stack by optimizing the index of refraction and/or thickness of the film stack components (e.g., photoresist layer 110, underlying layer 112, and/or substrate 104). In one embodiment, the photoresist layer 110 may be selected to include an upper interface index of refraction that may be tuned in conjunction with the photoresist layer thickness, light wavelength, and/or the reflectivity of the underlying layer to generate a higher degree of constructive interference between incident and reflected light within the photoresist layer 110. In this instance, the highest amount of interference will be closer to the top surface of the photoresist layer 110 than to the interface of the photoresist layer 110 and the underlying layer 112. In another embodiment, the photoresist layer 110 may be selected to include a lower interface index of refraction that may be tuned in conjunction with the photoresist layer thickness, light wavelength, and/or the reflectivity of the underlying layer to generate a higher degree of constructive interference between incident and reflected light within the photoresist layer 110. In this instance, the highest amount of interference will be closer to the interface of the photoresist layer 110 and the underlying layer 112 than to the top surface of the photoresist layer 110.

Broadly, the index of refraction for the photoresist layer 110 may vary between 0.95 and 1.75 and have a thickness that may vary between 30 nm to 250 nm. For example, the index of refraction for photoresist layers 110 that target light wavelengths of about 248 nm may have an index of refraction between 1.3 to 1.75 and a thickness 80 nm to 250 nm, more particularly between 100 nm to 120 nm. Photoresist layers 110 that target light wavelengths of about 193 nm may range between 1.65 to 1.75 and a thickness 80 nm to 250 nm, more particularly between 100 nm to 120 nm. EUV photoresist layers 110 that target wavelengths of less than 15 nm may have an index of refraction between 0.95 to 1.05 and thickness between 30 nm to 60 nm.

In one embodiment, the film stack properties may be optimized to achieve higher light interference between incident light 114 and reflected light (not shown) at the interface between the photoresist layer 110 and the underlying layer 112. The higher light interference may be tuned to occur within a horizontal plane across the film stack. In one embodiment, the interference plane may be at or proximate to the interface between the photoresist layer 110 and the underlying layer 112. However, the interference plane may not be limited to the interface and may adjusted using the techniques described in the application or that would be understood by a person of ordinary skill in the art. The higher energy distributed across the interference plane may generate higher concentrations of acid 106 across plane than in other regions of the photoresist layer 110. The higher concentration of acid 106 at the interface may be used to remove or decompose organic substances on the surface of the underlying layer 112 or to tailor the profile angle or geometry of the photoresist layer 110 when it is developed.

In another embodiment, the interference plane may be located at the surface of the photoresist layer 110 that is opposite the interface between the photoresist layer 110 and the underlying layer 112. The higher light interference may generate at higher acid concentration across the photoresist layer 110. The higher acid concentration may alter the profile angle or geometry of the developed photoresist layer 110. For example, the openings in the developed photoresist layer 110 may be wider at the top of the opening than at the interface of the photoresist layer 110 and the underlying layer 112. Controlling the location and concentration of the acid 106 enables the adjustment of the profile angle or geometry of the openings in the photoresist layer 110. These optimized opening geometries may be used to minimize micro-bridging in line/space patterning and/or scumming of contact hole patterning.

At block 208, the two-step process may include exposing a first light 114 wavelength(s) through a pattern mask 116 onto the film stack on the substrate 104. In one embodiment, the photoresist layer 110 may include a PS-CAR chemistry that may generate a low amount of acid 106 when exposed to wavelengths of light that are less than 300 nm. The acid generation may occur proximate to the exposed portions of the photoresist layer 110. The light 114 from the pattern mask 116 may leave unexposed portions of the photoresist layer 110 that may have a lower acid concentration than the exposed portions of the photoresist layer 110.

In other embodiments, the dose and wavelength of the light 124 may be varied to adjust acid concentration amount within the exposed portions of the photoresist layer 110. For example, in a EUV embodiment, the light 114 wavelengths may be less than 15 nm or approximately 13.5 nm. In this instance, the exposure process may limit the light 114 to the EUV spectrum, such that out-of-bound radiation (e.g., UV light, ~>30 nm) may not be exposed to the photoresist layer 110. However, in other embodiments, the light 114 may include a broader range of wavelengths than the EUV embodiment. For example, the light 114 may include wavelengths within the EUV and UV spectrum, but may not include wavelengths from the entire EUV or UV spectrum.

In one specific embodiment, the light 114 may include the EUV spectrum and a portion of the UV spectrum up to 200 nm, but may not include light 114 with a wavelength of greater than 200 nm. For example, the exposure process may include light 114 with wavelengths of no more than 193 nm. However, in another embodiment, the exposure process may include light 114 with wavelengths of not more than 248 nm and may include the 13.5 nm and 193 nm wavelengths.

In another specific embodiment, the light 114 may include the UV spectrum and may exclude the EUV spectrum. Hence, the exposure process may include a 193 nm process or a 248 nm process, but may not include light 114 with a wavelength of less than 30 nm.

The initial amount of acid 106 and PS 108 that may be generated in the exposed regions of the photoresist layer 110 may be increased to a larger amount by exposing the acid 106 and the PS 108 to additional energy (e.g., light 124) to increase the amount of acid and/or diffuse the acid within the photoresist layer 110.

At block 210, the photoresist layer 110 may be exposed to a second range of wavelengths of light 124 that may be different from the wavelength of the first exposure. Additionally, the second exposure may be a blanket exposure or a flood exposure that exposes the entire photoresist layer 110 to the light 124. However, a blanket exposure may not be required and a patterned exposure may be done in the alternative.

In one embodiment, the blanket exposure may be used to enable a higher concentration of the acid proximate to an upper region of the photoresist layer 110 that is near the top or surface of the photoresist layer 110. Broadly, the acid concentration will be higher near the upper surface of the photoresist layer 110 than at the interface of the photoresist layer 110 and the underlying layer 112. The energy from the blanket exposure may be used in conjunction with the characteristics of the film stack (e.g., RI, thickness, composition) to enable this acid profile. The incoming wavelength may be optimized to generate a higher amount of constructive interference between the incident light and the reflected light in an upper region or portion of the photoresist layer 110. The blanket exposure may include a wavelength of 300 nm to 400 nm and/or a dose between 0.1 J/cm2 and 4 J/cm2. The specific process conditions may be determined in view of the film stack composition and those process conditions may be derived from the ranges provided.

In one embodiment, the blanket exposure may be used to enable a higher concentration of the acid proximate to an interface of the photoresist layer 110 and the underlying layer 112. Broadly, the acid concentration will be higher near the interface of the photoresist layer 110 and the underlying layer 112 than at the upper surface of the photoresist layer 110. The energy from the blanket exposure may be used in conjunction with the characteristics of the film stack (e.g., RI, thickness, composition) to enable this acid profile. The incoming wavelength may be optimized to generate a higher amount of constructive interference between the incident light and the reflected light in an upper region or portion of the photoresist layer 110. The blanket exposure may include a wavelength of 300 nm to 400 nm and/or a dose between 0.1 J/cm2 and 4 J/cm2. The specific process conditions may be determined in view of the film stack composition and those process conditions may be derived from the ranges provided.

In one embodiment, the second exposure may include light with wavelengths greater than 300 nm, when the first exposure has wavelengths of less than 300 nm. More specifically, when the first exposure had wavelengths within the EUV spectrum. In one specific embodiment, the second exposure wavelengths may be about 365 nm when the first exposure had wavelengths less than or equal to about 248 nm, 193 nm, or 13.5 nm. In one specific embodiment, the wavelengths of light 124 may be about 365 nm.

In another embodiment the composition of the photoresist layer 110 or the underlying layer 112 may be altered to impact reflectivity. For example, the photoresist layer 110 or the underlying layer 112 may be doped with chromophores (not shown) that may limit reflectivity by absorbing light 124 or selectively absorbing certain light 124 wavelengths and reflecting other light 124 wavelengths. In this way, the chromophores may be selected to absorb certain wavelengths of light to optimize the amount of light wavelengths that may be reflected back into the photoresist layer 110. Typically, chromophores are generally organic compounds that include a carbon element and at least one or more of the following elements: H, O, N, Cl, Br, S, or I. The maximum absorbance wavelength of the chromophore compounds may vary between 250 nm and 400 nm. One or more chromophores may be selected to filter out undesirable light 124 wavelengths that may be reflected by an underlying layer 112 or absorbed by an overlying layer (not shown) of the photoresist layer 110. The chromophore compounds may include, but are not limited to, $CH_3$—$CH_3$, $CH_4$, $CH_3OH$, or $CH_3$—$SH$. In addition to the type and concentration, the location of the chromophore within the ARC layer 128 or the photoresist layer 110 may also impact reflectivity. The reflectivity may be impacted based, at least in part, on where the highest concentration of the chromophore is within the ARC layer 128 or the photoresist layer 110. The highest concentration may be located at any location within the photoresist layer 110 or the underlying layer 112. Generally, the concentration difference between a high concentration region and a low concentration region may be greater than at least 5% by volume, mass, or moles.

In one embodiment, the chromophore comprises a higher concentration at an interface of the photoresist layer 110 and the underlying layer 112 than the remaining portion of the underlying layer 112 or the photoresist layer 110. In another embodiment, the chromophore comprises a higher concentration proximate to a surface of the photoresist layer 110 that is opposite an interface of photoresist layer 110 and the underlying layer 112. The photoresist layer 110 may have a higher concentration of chromophore than the underlying layer 112. In this instance, the surface or the top portion of the photoresist layer 110 may have the highest chromophore concentration in this film stack embodiment. The light 124 may be reflected or absorbed by the top surface of the photoresist layer 110 which may minimize the amount of energy (e.g., light 124) that may be used to generate acid 106 or PS 108.

At block 212, the photoresist layer 110 may be developed using a chemical treatment to remove portions 214 of the photoresist layer 110 that were made soluble by the two-step exposure process. The photoresist layer 110 may include a positive resist or a negative resist. Exposed portions of the positive resist may become soluble when exposed to light, whereas exposed portions of the negative resist become insoluble. The two-step exposure process may use any type of resist without limitation.

In another embodiment of the two-step process, a bake step may be incorporated either after the first exposure (e.g., EUV) but before the second exposure (e.g., UV flood) or during the second exposure itself. As EUV exposure dose approaches its minimum limits, photon/secondary electron shot statistics problems are known as EUV shot noise. Since the PS 122 is created in close proximity to any converted PAG, the PS 122 will largely replicate the issue. The PS 108 concentration shot noise effect will likely lead to non-optimum line width roughness (LWR), LER, and CER depending on feature without smoothing of PS 108 concentration shot noise effects prior to or in-situ to UV flood excitation, the PS 108 concentration shot noise. This issue may be overcome by the incorporation of a bake step prior to or during the UV flood step to induce PS 108 diffusion, on the order sub 10 nm, to smooth out the PS 108 concentration shot noise and lead to better LWR, LER, and CER depending on the feature type. Ideally, the activation energy for PS 108 diffusion could be designed such that it is much lower than the acid diffusion and amplification activation energies, so that a pre-flood or in-situ flood bake could effectively only lead to PS 108 diffusion. If this is not the case, then some level of flood bake and traditional post exposure bake (after PS 122 has converted additional PAGs to acids) co-optimization may be needed.

In one embodiment, the bake step may include heating the substrate, following the first exposure, to between 30° C. to 60° C. for no more than 120 seconds. Alternatively, the heating could also be done between 30° C. to 90° C. for no more than 120 seconds. In certain instances, a bake step may be done after the second exposure to improve LWR, LER, and CER depending on the feature type. The second heating process may be between 80° C. to 130° C. for no more than 120 seconds.

Other embodiments of the two-step process may include additional techniques to vary how light 124 may be reflected within the film stack. This may include disposing an intermediate layer between the photoresist layer 110 and the underlying layer 112. The intermediate layer (not shown) may be used to control the reflectivity during the exposures. Additionally, the intermediate layer may also incorporate the PS-CAR chemistry to generate a higher concentration of acids than in the photoresist layer 110 that may not include the PS-CAR chemistry. Alternatively, in other embodiments, the new film stack may be designed to generate higher concentrations of acid in the photoresist layer than in the intermediate layer. For example, the photoresist layer 110 may include the PS-CAR chemistry instead of the intermediate layer.

Figure 3A:
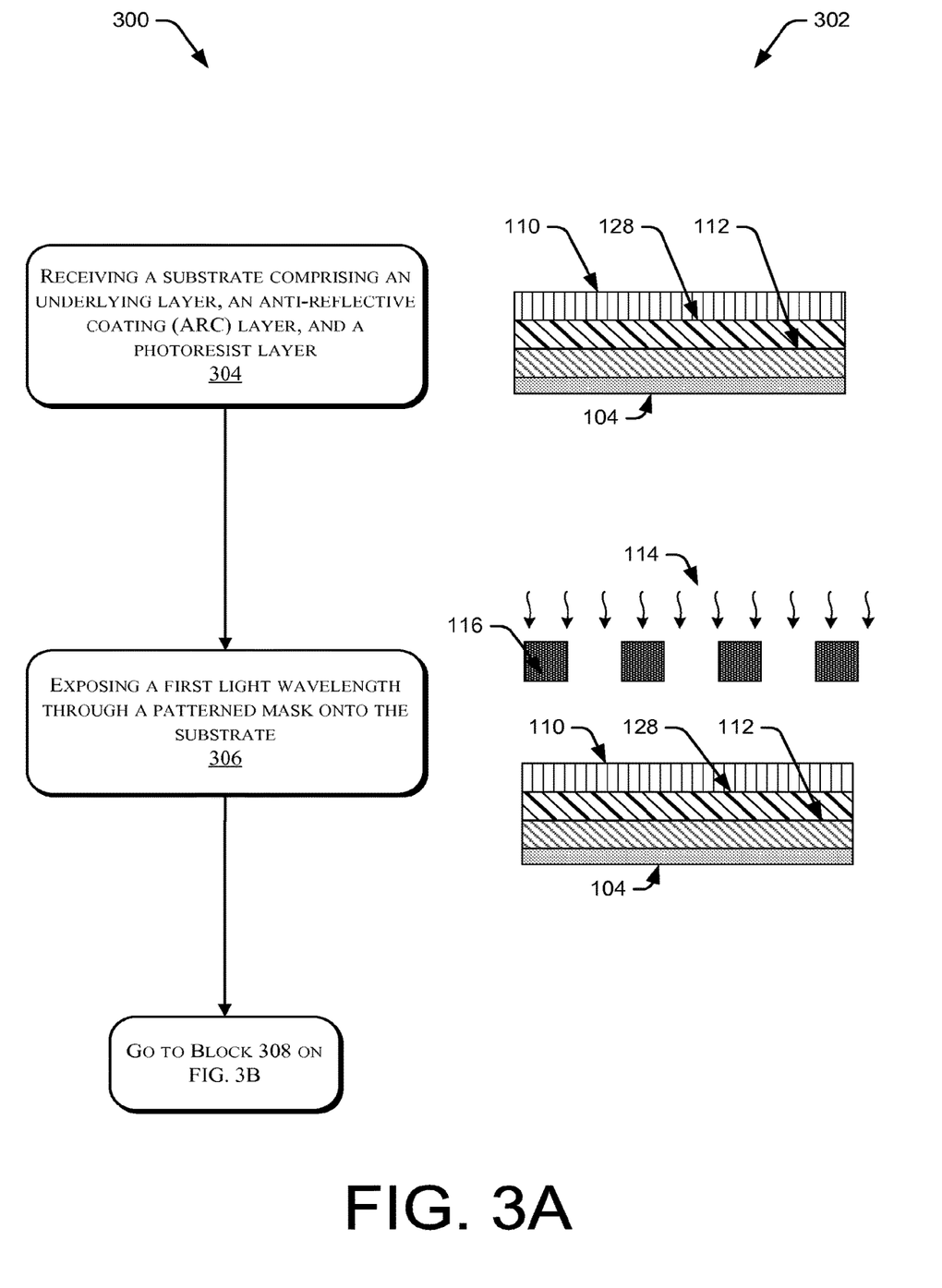
FIGS. 3A-3B include an illustration of a flow diagram of a method for a two-step exposure process of another film stack (e.g., photoresist layer and ARC layer) and accompanying cross section representations of one embodiment of the method.
Figure 3B:
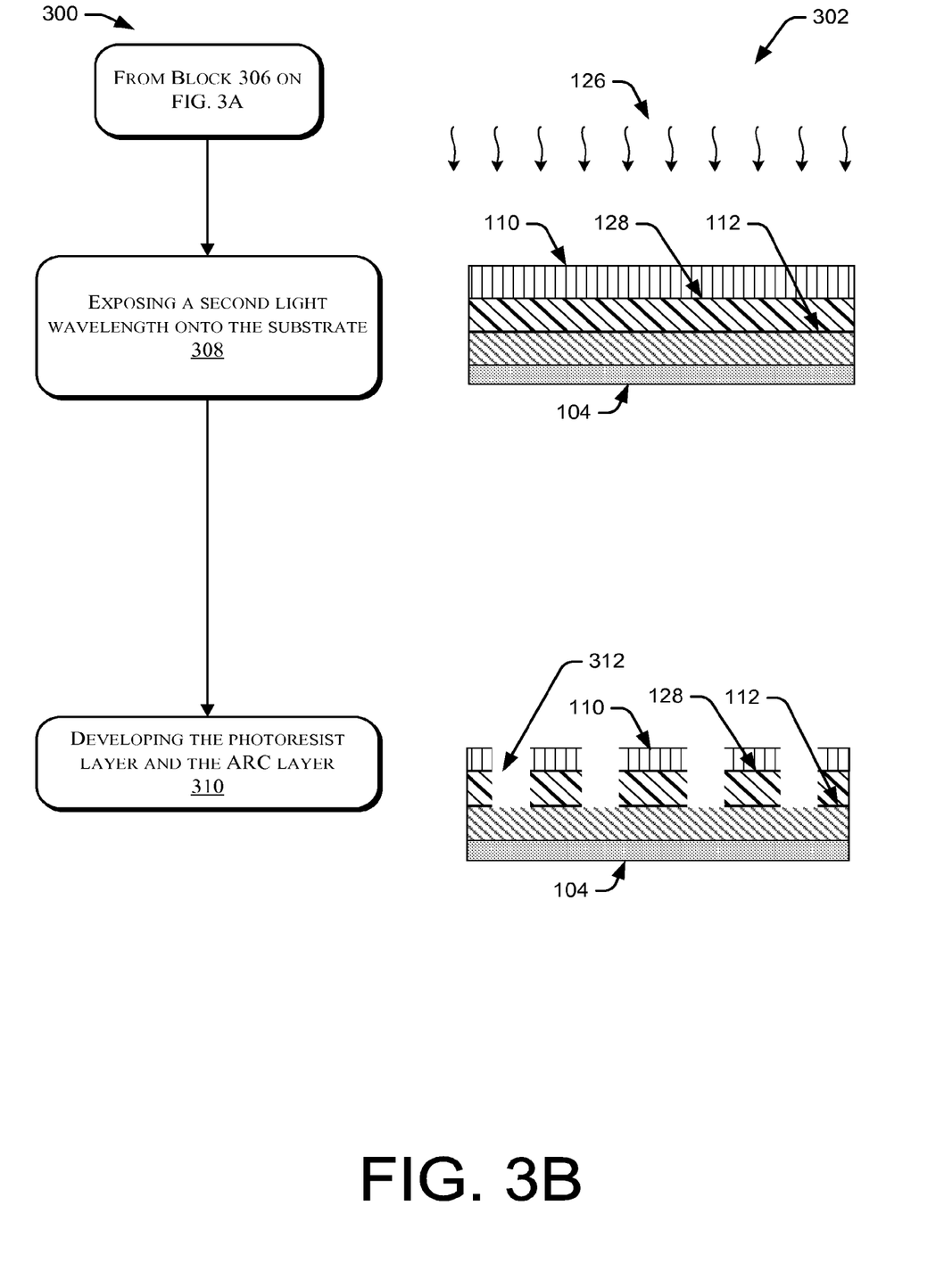

FIGS. 3A-3B include an illustration of a flow diagram 300 of a method for a two-step exposure process of another film stack (e.g., photoresist layer and anti-reflective layer) and accompanying cross section representations 302 of one embodiment of the method. In addition to varying the photoresist layer 110 and the underlying layer 112, the reflectivity and absorption of light in the film stack may also be varied by adding and/or removing components of the film stack. In one approach, the film stack may include an ARC layer 128 disposed between the photoresist layer 110 and the underlying layer 112. The ARC layer 128 may impact the location of the interference plane and may influence the acid concentrations within the photoresist layer 110 as described in the FIG. 2 embodiment. However, in other embodiments, the PS-CAR chemistry may be incorporated into the ARC layer 128 instead of the photoresist layer 110. In this way, the acid concentration may be varied through the ARC layer 128 using techniques similar to those described in the FIG. 2 embodiment. Accordingly, the film stack characteristics and exposure conditions may vary depending on the location of the PS-CAR chemistry within the film stack.

At block 304, the substrate is received comprising an underlying layer 112 and an ARC layer 128 disposed over the underlying layer 112 and a photoresist layer 110 disposed over the ARC layer 128. The film stack may be configured to incorporate the PS-CAR chemistry into the ARC layer 128 and/or the photoresist layer 110 to generate higher acid concentrations at different locations within the film stack under varying exposure conditions and film stack characteristics (e.g., RI, thickness, etc.).

The ARC layer 128 or the photoresist layer 100 may include two or more light wavelength activation thresholds that may enable a controlled sequence of chemical reactions within the ARC layer 128 or the photoresist layer 100 to generate acid at select locations and at different concentrations. The ARC layer 128 or the photoresist layer 100 may include a PS-CAR chemistry that may generate different concentrations or amounts of acid depending on the wavelength and/or dose of light and characteristics of the films stack (e.g., RI, thickness, composition, etc.). The ARC layer 128, photoresist layer 110 and the underlying layer 112 may also be configured using the techniques or methods to optimize reflectivity or absorbance as described in the description of FIGS. 1A-1D and 2.

At block 306, a first range of light 114 wavelengths may be exposed to the substrate 104 through a patterned mask 116. As described in the descriptions of FIGS. 1A-1B and 2, the exposed areas may have a higher concentration acid 106 and PS 108 than the unexposed areas. For example, when light 114 within a first range of wavelength is exposed to the ARC layer 128 and the photoresist layer 110, the PS-CAR chemistry may generate a first amount of acid 106 within the ARC layer 128 or photoresist layer 110. The initial acid 106 may be generated in the ARC layer 128 when the PS-CAR chemistry has been incorporated into the ARC layer 128 or in the photoresist layer 110 when the PS-CAR chemistry has been incorporated into the photoresist layer 110. However, the PS-CAR chemistry may be partially decomposed and may still be capable of generating additional acid when the PS-CAR chemistry is exposed to light within a second range of wavelength.

At block 308, the substrate 104 may be exposed to a second range of light 126 wavelengths (e.g., >300 nm) that may decompose the PAG and/or excite the PS 122 to decompose the PAG to generate a higher concentration of acid 120 within the ARC layer 128 or the photoresist layer 110. The second exposure may be a blanket exposure that distributes light 124 across the entire ARC layer 128 and the photoresist layer 110. As a result of the blanket exposure, the portions of the ARC layer 128 or the photoresist layer 110 that include the PS 122 will have a higher acid 120 generation rate or concentration than the portions of the ARC layer 128 or the photoresist layer 110 that do not include the PS 122 or, at least, a lower concentration of the PS 122.

The amount of energy transferred to PAG or the PS 122 may be optimized by varying the exposure process conditions (e.g., wavelength, dose, etc.) and the characteristics of the films stack (e.g., RI, thickness, composition, etc.). The process conditions and characteristics may be optimized to control the location of the interference plane, as described above in the description of FIGS. 1A-1D & FIG. 2, which enables a higher amount of energy to be transferred to the PAG or PS 122 in the ARC layer 128 or the photoresist layer 110 along or proximate to the interference plane.

In a first embodiment, the exposure process conditions (e.g., wavelength, dose, etc.) and the characteristics of the films stack may be optimized to enable a higher concentration of the acid 120 proximate to an interface between the ARC layer 128 and the photoresist layer 100 than at an interface between the ARC layer 128 and the underlying layer 112. The second exposure process conditions may include, but are not limited to, wavelengths between 300 nm and 400 nm and doses between 0.1 J/cm2 and 1 J/cm2. The specific process conditions may be determined in view of the film stack composition and those process conditions may be derived from the ranges provided.

In a second embodiment, the exposure process conditions (e.g., wavelength, dose, etc.) and the characteristics of the films stack may be optimized to enable a higher concentration of the acid 120 proximate to an interface between the ARC layer 128 and the underlying layer 112 than at an interface between the ARC layer 128 and the photoresist layer 110. The second exposure process conditions may include, but are not limited to, wavelengths between 300 nm and 400 nm and doses between 0.1 J/cm2 and 4 J/cm2. The specific process conditions may be determined in view of the film stack composition and those process conditions may be derived from the ranges provided.

In a third embodiment, that may not include the ARC layer 128, the exposure process conditions (e.g., wavelength, dose, etc.) and the characteristics of the films stack may be optimized to enable a higher concentration of the acid 120 proximate to an upper region of the photoresist layer 110 than at an interface between the photoresist layer 110 and the underlying layer 112. The second exposure process conditions may include, but are not limited to, wavelengths between 300 nm and 400 nm and doses between 0.1 J/cm2 and 4 J/cm2. The specific process conditions may be determined in view of the film stack composition and those process conditions may be derived from the ranges provided.

In a fourth embodiment, that may not include the ARC layer 128, the exposure process conditions (e.g., wavelength, dose, etc.) and the characteristics of the films stack may be optimized to enable a higher concentration of the acid 120 proximate to an interface between the photoresist layer 110 and the underlying layer 112 than at an upper region of the photoresist layer 110. The second exposure process conditions may include, but are not limited to, wavelengths between 300 nm and 400 nm and doses between 0.1 J/cm2 and 4 J/cm2. The specific process conditions may be determined in view of the film stack composition and those process conditions may be derived from the ranges provided.

In a fifth embodiment, that may be used in conjunction with any of the previous four embodiments, the film stack may be optimized to control the location of the interference plane within the ARC layer 128 or the photoresist layer 110. In this instance, the ARC layer 128 or the photoresist layer 110 comprises an upper interface index of refraction or a chromophore compound that generates higher light interference closer to an interface of the ARC layer 128 and the photoresist layer 110 than at an interface of the ARC layer 128 and the underlying layer 112. The index of refraction may vary between the ranges described above in the descriptions of FIGS. 1A-1D and FIG. 2 to adjust the location of the interference plane in the ARC layer 128 or the photoresist layer 110. One variation of this embodiment may include the film stack when the ARC layer 128 is omitted. The upper interface index of refraction or a chromophore compound generates higher light interference closer to an upper region of the photoresist layer 110 than at an interface of the photoresist layer 110 and the underlying layer 112.

In a sixth embodiment, that may be used in conjunction with any of the first through fourth embodiments, the film stack may be optimized to control the location of the interference plane within the ARC layer 128 or the photoresist layer 110. In this instance, the ARC layer 128 or photoresist layer 110 comprises a lower interface index of refraction or a chromophore compound that generates higher light interference closer to an interface of the ARC layer 128 and the underlying layer 112 than at an interface of the ARC layer 128 and the photoresist layer 110. The index of refraction may vary between the ranges described above in the descriptions of FIGS. 1A-1D and FIG. 2 to adjust the location of the interference plane in the ARC layer 128 or the photoresist layer 110. One variation of this embodiment may include the film stack when the ARC layer 128 is omitted. The lower interface index of refraction or a chromophore compound generates higher light interference closer to the interface of the photoresist layer 110 and the underlying layer 112 than an upper region of the photoresist layer 110.

In other embodiments, the second exposure may be a patterned exposure that may use a mask to generate exposed and unexposed areas in the photoresist layer 110. The mask may or may not be the same mask 116 that was used during the first exposure. In this way, the photoresist layer 110 may include three or more different regions that have varying amounts of acid. Hence, the developed photoresist layer 110 may have openings with at least two different profile angles or geometries.

At block 310, the photoresist layer 110 may be developed using a chemical treatment to remove portions 214 of the photoresist layer 110 that were made soluble by the two-step exposure process. The photoresist layer 110 may include a positive resist or a negative resist. Exposed portions of the positive resist may become soluble when exposed to light, whereas exposed portions of the negative resist become insoluble. The two-step exposure process may use any type of resist without limitation.

In another embodiment of the two-step process, a bake step may be incorporated either after the first exposure (e.g., EUV) but before the second exposure (e.g., UV flood) or during the second exposure itself. As EUV exposure dose approaches its minimum limits, photon/secondary electron shot statistics problems are known as EUV shot noise. Since the PS 122 is created in close proximity to any converted PAG, the PS 122 will largely replicate the issue. The PS 108 concentration shot noise effect without smoothing of PS 108 concentration shot noise effects prior to or in-situ to UV flood excitation, the PS 108 concentration shot noise will likely lead to non-optimum line width roughness (LWR), LER, and CER depending on the feature type. This issue may be overcome by the incorporation of a bake step prior to or during the UV flood step to induce PS 108 diffusion, on the order sub 10 nm, to smooth out the PS 108 concentration shot noise and lead to better LWR, LER, and CER depending on the feature type. Ideally, the activation energy for PS 108 diffusion could be designed such that it is much lower than the acid diffusion and amplification activation energies, so that a pre-flood or in-situ flood bake could effectively only lead to PS 108 diffusion. If this is not the case, then some level of flood bake and traditional post exposure bake (after PS 122 has converted additional PAGs to acids) co-optimization may be needed.

In one embodiment, the bake step may include heating the substrate, following the first exposure, to between 30° C. to 60° C. for no more than 120 seconds. Alternatively, the heating could also be done between 30° C. to 90° C. for no more than 120 seconds. In certain instances, a bake step may be done after the second exposure to improve LWR, LER, and CER depending on the feature type. The second heating process may be between 80° C. to 130° C. for no more than 120 seconds.

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method for treating a substrate, comprising:
   receiving the substrate comprising an underlying layer on a surface of the substrate, an anti-reflective coating (ARC) layer on the underlying layer, and a photoresist layer on the ARC layer, the ARC layer comprising:
   a first light wavelength activation threshold that controls the generation of acid to a first acid concentration in the ARC layer and that controls the generation of photosensitizer to a first photosensitizer concentration in the ARC layer; and
   a second light wavelength activation threshold that increases the first acid concentration to a second acid concentration, the second light wavelength activation threshold being different from the first light wavelength activation threshold;
   exposing a first wavelength of light onto the substrate, the first exposure being a patterned exposure of the substrate to expose areas of the ARC layer to the first wavelength of light, wherein the first exposure generates the first acid concentration and the first photosensitizer concentration in the exposed areas of the ARC layer, the exposed areas being adjacent unexposed areas of the ARC layer in which no acid is generated;
   exposing a second wavelength of light onto the substrate, the second exposure being a blanket exposure of the substrate in which all the exposed areas and the unexposed areas are exposed to the second wavelength of light, wherein the second exposure generates the second acid concentration in the exposed areas of the ARC layer, the second concentration being higher than the first acid concentration, wherein following the second exposure, the exposed areas are adjacent the unexposed areas in which no acid is generated;
   developing the photoresist layer to generate one or more openings in the photoresist layer that are aligned with the exposed areas of the ARC layer; and
   developing the exposed areas of the ARC layer to generate one or more openings in the ARC layer that are aligned with the one or more openings in the photoresist layer.

2. The method of claim 1, wherein the photoresist layer comprises:
   a third light wavelength activation threshold that controls the generation of acid to a third acid concentration in the photoresist layer; and
   a fourth light wavelength activation threshold that increases the third acid concentration to a fourth acid concentration, the fourth light wavelength activation threshold being different from the third light wavelength activation threshold.

3. The method of claim 1, wherein the exposure of the second wavelength of light comprises an upper interface wavelength and an upper interface dose that enables a higher concentration of the acid proximate to an interface between the ARC layer and the photoresist layer than at an interface between the ARC layer and the underlying layer.

4. The method of claim 3, wherein the upper interface wavelength comprises a wavelength between 300 nm and 400 nm, and the upper interface dose comprises a magnitude between 0.1 J/cm2 and 4 J/cm2.

5. The method of claim 1, wherein the exposure of the second wavelength of light comprises a lower interface wavelength and a lower interface dose that enables a higher concentration of the acid proximate to an interface between the ARC layer and the underlying layer than at an interface between the ARC layer and the photoresist layer.

6. The method of claim 5, wherein the lower interface wavelength comprises a wavelength between 300 nm and 400 nm, and the lower interface dose comprises a magnitude between 0.1 J/cm2 and 4 J/cm2.

7. The method of claim 1, wherein the ARC layer comprises an upper interface index of refraction or a chromophore compound that generates higher light interference closer to an interface of the ARC layer and the photoresist layer than at an interface of the ARC layer and the underlying layer.

8. The method of claim 1, wherein the ARC layer comprises a lower interface index of refraction or a chromophore compound that generates higher light interference closer to an interface of the ARC layer and the underlying layer than at an interface of the ARC layer and the photoresist layer.

9. The method of claim 1, wherein the ARC layer comprises:
   a photosensitizer generation compound comprising:
      acetophenone;
      triphenylene;
      benzophenone;
      fluorenone;
      anthraquinone;
      phenanthrene; or
      derivatives thereof; and
   a photoacid generation compound comprising:
      at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorpheny 1]-2,2,2-trichloroethane (DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane,4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

10. The method of claim 1, wherein the ARC layer comprises benzyl methacrylate or mevalonic lactone methacrylate.

11. The method of claim 1, wherein the ARC layer comprises a thickness between 30 nm and 120 nm.

12. The method of claim 1, wherein the photoresist layer comprises a thickness between 30 nm and 60 nm or 80 nm and 250 nm.

13. A method for treating a substrate, comprising:
   receiving the substrate comprising an underlying layer on the substrate;
   depositing a photoresist layer on the underlying layer, the photoresist layer comprising:
   a photosensitizer generation compound;
   a photoacid generation compound;
   a first light wavelength activation threshold including a first range of wavelengths that controls the generation of acid from the photoacid generation compound to a first acid concentration and an initial amount of photosensitizer from the photosensitizer generation compound in the photoresist layer; and
   a second light wavelength activation threshold including a second range of wavelengths that increases the first acid concentration to a second acid concentration, the second light wavelength activation threshold being different from the first light wavelength activation threshold;

exposing a first wavelength of light in the first range of wavelengths through a patterned mask onto the substrate, wherein the first exposure generates a first concentration of acid and an initial amount of photosensitizer in an exposed area of the photoresist layer, the exposed area being adjacent an unexposed area in which no acid is generated;

exposing a second wavelength of light to the substrate after exposing the first wavelength of light onto the substrate, the second wavelength of light comprising a wavelength that is in the second range of wavelengths, wherein the second exposure exposes the exposed area and the unexposed area to the second wavelength of light and generates a second concentration of the acid in the exposed area of the photoresist layer without generation of acid in the unexposed area, the second concentration of acid being higher than the first concentration of acid; and developing the photoresist layer to generate one or more openings in the photoresist layer that are aligned with the patterned mask, wherein either the exposure of the second wavelength of light comprises an upper interface wavelength and an upper interface dose that enables the second concentration of the acid proximate to an upper region of the photoresist layer than at an interface between the photoresist layer and the underlying layer or the exposure of the second wavelength of light comprises a lower interface wavelength and a lower interface dose that enables the second concentration of the acid proximate to an interface between the photoresist layer and the underlying layer than at an upper region of the photoresist layer.

14. The method of claim 13, further comprising depositing an anti-reflective coating (ARC) layer on the substrate, the ARC layer being disposed between the underlying layer and the photoresist layer.

15. The method of claim 13, wherein the upper interface wavelength comprises a wavelength between 300 nm and 400 nm, and the upper interface dose comprises a magnitude between 0.1 J/cm$^2$ and 4 J/cm$^2$.

16. The method of claim 13, wherein the lower interface wavelength comprises a wavelength between 300 nm and 400 nm, and the lower interface dose comprises a magnitude between 0.1 J/cm$^2$ and 4 J/cm$^2$.

17. The method of claim 13, wherein the photoresist layer comprises an upper interface index of refraction or a chromophore compound that generates higher light interference closer to an interface of the underlying layer and the photoresist layer than at an upper region of the photoresist layer.

18. The method of claim 13, wherein the photoresist layer comprises a lower interface index of refraction or a chromophore compound that generates higher light interference closer to an upper region of the photoresist layer than at an interface of the underlying layer and the photoresist layer.

19. The method of claim 13, wherein the photosensitizer generation compound comprises:
acetophenone;
triphenylene;
benzophenone;
fluorenone;
anthraquinone;
phenanthrene; or
derivatives thereof.

20. The method of claim 19, wherein the photoacid generation compound comprises:
at least one of triphenylsulfonium triflate, triphenylsulfonium nonaflate, triphenylsulfonium perfluorooctylsulfonate, triarylsulfonium triflate, triarylsulfonium nonaflate, triarylsulfonium perfluorooctylsulfonate, a triphenylsulfonium salt, a triarylsulfonium salt, a triarylsulfonium hexafluoroantimonate salt, N-hydroxynaphthalimide triflate, 1,1-bis[p-chlorophenyl]-2,2,2-trichloroethane(DDT), 1,1-bis[p-methoxyphenyl]-2,2,2-trichloroethane, 1,2,5,6,9,10-hexabromocyclododecane, 1,10-dibromodecane, 1,1-bis[p-chlorophenyl]2,2-dichloroethane,4,4-dichloro-2-(trichloromethyl)benzhydrol, 1,1-bis(chlorophenyl) 2-2,2-trichloroethanol, hexachlorodimethylsulfone, 2-chloro-6-(trichloromethyl)pyridine, or derivatives thereof.

21. A method for treating a substrate, comprising:
receiving the substrate comprising an underlying layer on a surface of the substrate, an anti-reflective coating (ARC) layer on the underlying layer, and a photoresist layer on the ARC layer, the ARC layer comprising:
a first light wavelength activation threshold that controls the generation of acid to a first acid concentration in the ARC layer; and
a second light wavelength activation threshold that increases the first acid concentration to a second acid concentration, the second light wavelength activation threshold being different from the first light wavelength activation threshold;

exposing a first wavelength of light onto the substrate, the first exposure being a patterned exposure of the substrate, wherein the first exposure generates a first concentration of acid in the ARC layer;

exposing a second wavelength of light onto the substrate, the second exposure being a blanket exposure of the substrate, wherein the second exposure generates a second concentration of the acid in the ARC layer, the second concentration being higher than the first concentration, developing the photoresist layer to generate one or more openings in the photoresist layer that are aligned with the patterned exposure; and developing the ARC layer to generate one or more openings in the ARC layer that are aligned with the patterned exposure, wherein the exposure of the second wavelength of light comprises a lower interface wavelength and a lower interface dose that enables a higher concentration of the acid proximate to an interface between the ARC layer and the underlying layer than at an interface between the ARC layer and the photoresist layer.

22. A method for treating a substrate, comprising:
receiving the substrate comprising an underlying layer on a surface of the substrate, an anti-reflective coating (ARC) layer on the underlying layer, and a photoresist layer on the ARC layer, the ARC layer comprising:
a first light wavelength activation threshold that controls the generation of acid to a first acid concentration in the ARC layer; and
a second light wavelength activation threshold that increases the first acid concentration to a second acid concentration, the second light wavelength activation threshold being different from the first light wavelength activation threshold;

exposing a first wavelength of light onto the substrate, the first exposure being a patterned exposure of the substrate, wherein the first exposure generates a first concentration of acid in the ARC layer;

exposing a second wavelength of light onto the substrate, the second exposure being a blanket exposure of the substrate, wherein the second exposure generates a second concentration of the acid in the ARC layer, the second concentration being higher than the first concentration, developing the photoresist layer to generate one or more openings in the photoresist layer that are aligned with the patterned exposure; and developing the ARC layer to generate one or more openings in the ARC layer that are aligned with the patterned exposure, wherein the ARC layer comprises a lower interface index of refraction or a chromophore compound that generates higher light interference closer to an interface of the ARC layer and the underlying layer than at an interface of the ARC layer and the photoresist layer.

* * * * *

UNITED STATES PATENT AND TRADEMARK OFFICE
CERTIFICATE OF CORRECTION

PATENT NO. : 12,165,870 B2
APPLICATION NO. : 16/030153
DATED : December 10, 2024
INVENTOR(S) : Steven Scheer et al.

It is certified that error appears in the above-identified patent and that said Letters Patent is hereby corrected as shown below:

In the Specification

In Column 10, Lines 9-11, change "The FIG. 1C embodiment that incorporates the acid generation compounds within the photoresist layer 110 that is disposed above the ARC layer 128." to --The FIG. 1C embodiment incorporates the acid generation compounds within the photoresist layer 110 that is disposed above the ARC layer 128.--.

In Column 12, Line 12, change "not be limited to the interface and may adjusted using the" to --not be limited to the interface and may be adjusted using the--.

In the Claims

In Column 20, Claim 6, Line 7, change "between 0.1 J.cm2 and 4 J/cm2." to --between 0.1 J/cm2 and 4 J/cm2.--.

In Column 20, Claim 9, Line 37, change "1,1-bis[p-chlropheny 1]" to --1,1-bis[p-chlorophenyl]--.

Signed and Sealed this
First Day of April, 2025

Coke Morgan Stewart
*Acting Director of the United States Patent and Trademark Office*